United States Patent
Hwang et al.

(10) Patent No.: US 9,401,710 B2
(45) Date of Patent: Jul. 26, 2016

(54) ACTIVE DIODE HAVING IMPROVED TRANSISTOR TURN-OFF CONTROL METHOD

(71) Applicant: MAPS, INC., Yongin-si (KR)

(72) Inventors: Jong-Tae Hwang, Seoul (KR); Hyun-Ick Shin, Seoul (KR); Sang-O Jeon, Suwon-si (KR); Joon Rhee, Seoul (KR)

(73) Assignee: MAPS, Inc., Yongin-si (KR)

( * ) Notice: Subject to any disclaimer, the term of this patent is extended or adjusted under 35 U.S.C. 154(b) by 0 days.

(21) Appl. No.: 14/893,219

(22) PCT Filed: Apr. 25, 2014

(86) PCT No.: PCT/KR2014/003690
§ 371 (c)(1),
(2) Date: Nov. 23, 2015

(87) PCT Pub. No.: WO2014/196737
PCT Pub. Date: Dec. 11, 2014

(65) Prior Publication Data
US 2016/0105172 A1   Apr. 14, 2016

(30) Foreign Application Priority Data

Jun. 3, 2013 (KR) .................. 10-2013-0063577

(51) Int. Cl.
*H03B 1/00* (2006.01)
*H03K 3/00* (2006.01)
*H03K 17/687* (2006.01)
*H03K 5/13* (2014.01)
(Continued)

(52) U.S. Cl.
CPC .............. *H03K 17/687* (2013.01); *H03K 5/13* (2013.01); *H03K 5/2463* (2013.01); *H03K 2005/00019* (2013.01)

(58) Field of Classification Search
CPC ............ H03K 17/063; H03K 17/0822; H03K 17/04123
USPC ......... 327/108–112, 427, 434, 437, 493, 365, 327/368, 387, 389, 390, 104, 330; 326/82, 326/83, 87
See application file for complete search history.

(56) References Cited

U.S. PATENT DOCUMENTS 5,506,527 A * 4/1996 Rudolph .................. G06G 7/62
327/104
5,719,521 A * 2/1998 Wong ................. H03K 17/6871
327/108

(Continued)

FOREIGN PATENT DOCUMENTS

JP         06-284589 A    10/1994
JP       2001-008494 A     1/2001

(Continued)

OTHER PUBLICATIONS

International Search Report Issued on May 29, 2014 in counterpart of International Application No. PCT/KR2014/003690, 3 pages.

*Primary Examiner* — Lincoln Donovan
*Assistant Examiner* — Thomas Skibinski
(74) *Attorney, Agent, or Firm* — NSIP Law

(57) ABSTRACT

An active diode that features improved control of transistor turn-off is provided. Such an active diode may include a comparator to compare voltages between opposite ends of a parasitic diode, and a gate driver to control a gate terminal of the transistor according to the comparison result of the comparator. Furthermore, the active diode may further include an off-timing controller to control the transistor to be turned off at a point in time when voltages of the opposite ends of the parasitic diode turn positive. Thus, the active diode may be turned off when required.

6 Claims, 8 Drawing Sheets

(51) Int. Cl.
 *H03K 5/24* (2006.01)
 *H03K 5/00* (2006.01)

(56) References Cited

U.S. PATENT DOCUMENTS

| | | | | |
|---|---|---|---|---|
| 6,469,564 | B1 * | 10/2002 | Jansen | G06G 7/62 327/365 |
| 7,112,935 | B2 * | 9/2006 | Fujino | H02M 7/537 318/433 |
| 7,138,778 | B2 | 11/2006 | Fujino et al. | |
| 8,232,830 | B2 * | 7/2012 | Takeshita | H02M 7/217 327/330 |
| 2005/0218964 | A1 * | 10/2005 | Oswald | H02M 3/1588 327/493 |

FOREIGN PATENT DOCUMENTS

| | | |
|---|---|---|
| JP | 2004-201427 A | 7/2004 |
| JP | 4867279 | 4/2007 |

\* cited by examiner

ACTIVE DIODE HAVING IMPROVED TRANSISTOR TURN-OFF CONTROL METHOD

CROSS REFERENCE TO RELATED APPLICATION(S)

This Application is a U.S. national phase application under 35 U.S.C. §371 of PCT Application No. PCT/KR2014/003690 filed on Apr. 25, 2014, which claims the benefit of Korean Patent Application No. 10-2013-0063577 filed on Jun. 3, 2013, the entire disclosures of which are incorporated herein by reference.

TECHNICAL FIELD

The present invention relates to an active diode, and more specifically to technology for turning off a transistor switch of an active diode.

BACKGROUND ART

FIG. 1 is a diagram illustrating a pre-existing active diode circuit, and FIG. 2 is a diagram illustrating an example of forward turn-on caused by delays that may occur due to both a comparator and a gate driver, which are illustrated in FIG. 1.

An active diode includes a switch M1; and due to MOSFET properties, a parasitic diode D1 is placed between a drain and a source. When VKA, which is the voltages at the opposite ends of the parasitic diode D1, i.e., the voltages at cathode K and anode A, turns negative so that D1 is turned on, the active diode detects this point in time and turns on the switch M1 to reduce conduction loss. However, as can be seen in FIG. 2, if there is a case where delays have occurred due to both a comparator 10 and a gate driver 20 are long, as illustrated in FIG. 2, a section where M1 is turned on may be created even though VKA has been turned to (+). Here, a forward turn-on of the active diode occurs, which leads to unnecessary consumption of power. If a control circuit has been designed to have minimal delays, the section duration of the forward turn-on may be reduced; however, some inevitable delays do occur, and if a VKA signal is very fast, the problem caused by the delays may be greater.

In other words, in the case a high-speed input signal is processed using the active diode, the active diode is turned on due to the delay of the control signal controlled caused by the comparator 10, the gate driver 20, etc. even when the active diode should be turned off, thus resulting in the forward turn-on of the active diode. Such properties are what lead to unnecessary consumption of power

Technical Problem

The purpose of the present invention is to provide a technical solution to turn off an active diode at a point in time when it should be turned off.

Technical Solution

To achieve the above-mentioned technical solutions, in one general aspect, an active diode includes: a comparator to compare voltages at opposite ends of a parasitic diode of a transistor; and a gate driver to, in response to the comparison result of the comparator, control a gate terminal of the transistor, wherein the active diode further includes an off-timing controller to turn off the transistor at a point in time when the voltages at the opposite ends of the parasitic diode is positive.

The off-timing controller may adjust when the transistor is to be turned off based on an output signal from the comparator and a gate operation signal of the gate driver.

The off-timing controller may include: an off controller to receive the output signal from the comparator and output the received output signal, wherein the off controller delays and outputs the output signal of the comparator based on each inverted signal of the output signal from the comparator and the gate operation signal of the gate driver; and a logic circuit to receive the delayed output signal from the off controller and turn off the gate driver.

The off controller may include: a variable delay component to receive the output signal from the comparator and output the received output signal, wherein the off controller delays and outputs the output signal of the comparator according to a basic delay value and a variable additional delay value; and a counter to receive each inverted signal of the output signal from the comparator and the gate operation signal of the gate driver and count the additional delay value.

The counter may include: a D flip-flop to receive each inverted signal of the output signal from the comparator and the gate operation signal from the gate driver; and an up/down counter to count up or down the additional delay value according to the output of the D flip-flop.

The off controller may further include a delay component to delay the inverted signal of the gate operation signal and the delayed inverted signal to the D flip-flop.

The logic circuit may be an SR latch to receive the output signal of the comparator into a set terminal thereof and the delayed output signal of the off controller into a reset terminal thereof.

Advantageous Effects

When a high-speed input signal is processed using an active diode, the present invention turns off the active diode at the point in time when it should be turned off by compensating for the delay of control signal controlled caused by a comparator, a gate driver, etc., thereby preventing unnecessary consumption of power.

BEST MODE

The above-mentioned and additional aspects of the present invention may be clearer through preferred embodiments, which are described with reference to attached figures. Hereinafter, the present invention is specifically described so as to help those skilled in the art easily understand and implement the present invention through these exemplary embodiments.

Figure 1:
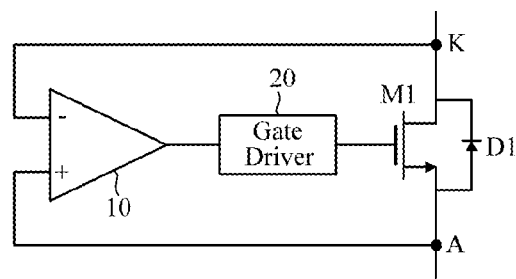
FIG. 1 is a diagram illustrating a pre-existing active diode circuit.
Figure 2:
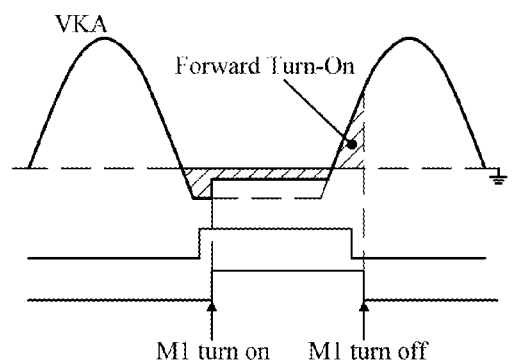
FIG. 2 is a diagram illustrating an example of forward turn-on caused by delays that may occur due to both a comparator and a gate driver, which are illustrated in FIG. 1.
Figure 3:
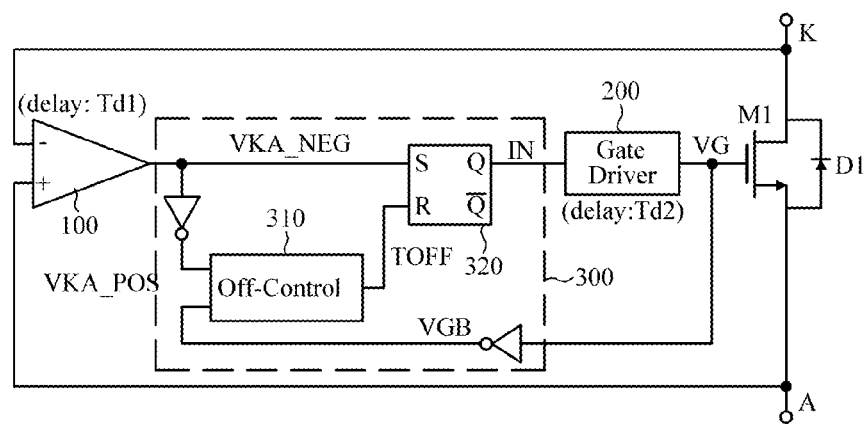
FIG. 3 is a diagram illustrating an example of an active diode circuit with an improved control of a MOSFET turn-off.
Figure 4:
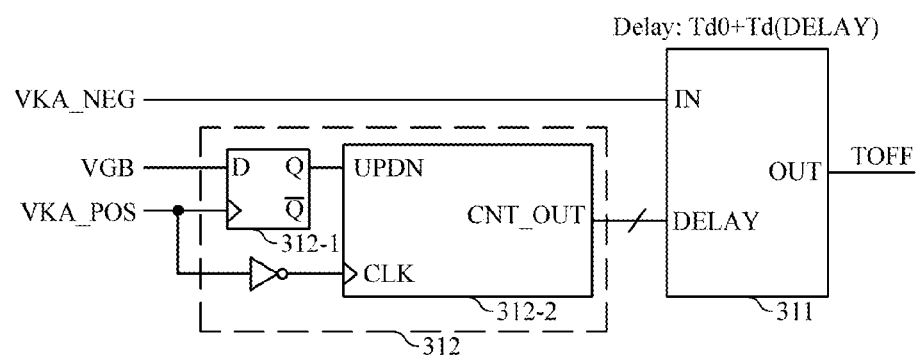
FIG. 4 is a diagram illustrating an example of an off-control circuit.

FIG. 3 is a diagram illustrating an example of an active diode circuit with an improved control of a MOSFET turn-off; and FIG. 4 is a diagram illustrating an example of an off-control circuit.

As illustrated in FIG. 3, an active diode includes a comparator 100 that compares the voltages at opposite ends of a parasitic diode D1 of M1; and a gate driver 200 that controls a gate terminal of M1 based on the comparison result of the comparator 100. The active diode according to an exemplary embodiment may further include an off-timing controller 300. The off-timing controller 300 controls M1 to be turned off at the point in time when VKA turns positive. According to an exemplary embodiment, the off-timing controller 300 may adjust the turn-off timing of M1 depending on an output signal from the comparator 100 and a gate operation signal from the gate driver 200.

As illustrated in FIG. 3, the off-timing controller 300 may include an off controller 310 and a logic circuit 320. The off controller 310 receives an output signal from a comparator 100 and outputs the received output signal; more specifically, it is the off controller 310 that determines the length of time the output is delayed in consideration of the inverted signals of both the output signal from the comparator 100 and of the gate operation signal from the gate driver 200, after which said off controller 310 delays the output as much as the determined delay time before it is sent out. When receiving the signal showing that the output has been delayed and output (hereinafter, referred to as 'delayed output signal') from the off controller 310 is received, the logic circuit 320 turns off the gate driver 200. As illustrated in FIG. 3, the logic circuit 320 may be an SR-latch.

As illustrated in FIG. 4, an off controller 310 may include a variable delay component 311 and a counter 312. The variable delay component 311 receives an output signal from a comparator 100 and outputs the signal to be delayed as much as the delay duration that has been determined according to a basic delay value and a variable additional delay value. The counter 312 counts the additional delay value by receiving the inverted signal of the output signal from the comparator 100 and that of the gate operation signal from the gate driver 200. As illustrated in FIG. 4, the counter 312 may include: a D-flip-flop 312-1, to which the inverted signals of both the output signal from the comparator 100 and the gate operation signal from the gate driver 200 are input; and an up/down counter 312-2 that adjusts the additional delay value according to the D-flip-flop 312-1.

Hereinafter, an operation of controlling a MOSFET turn-off of an active diode is described specifically with reference to FIGS. 3 and 4. The comparator 100 detects a voltage VKA and determines whether the detected voltage VKA is positive or negative. If the VKA is negative, VKA_NEG turns 'high'; and because VKA_NEG is the input S to the SR latch 320, the output of the SR latch 320 also turns 'high', which in turn makes for the input signal IN of the gate driver 200 to turn 'high', thus turning on M1. The off controller 310 is an off-control circuit that generates a TOFF signal by using a gate operation signal VG and the inverted signal of VKA_NEG. The TOFF signal is the input R (reset) of the SR latch 320, resulting in the output of the SR latch 320 becoming 'low'. Therefore, since the input signal IN of the gate driver 200 is 'low', M1 is turned off. Such a turn-off method allows the off controller 310 to generate an optimum off-time.

On the off-control circuit, the signal VKA_NEG passes through the variable delay component 311 and generates the TOFF signal. The variable delay component 311 has a basic delay of Td0, and generates the additional delay Td (DELAY) according to the input signal of the delay. Td0 is a value that is lower than half of the signal period of VKA. At the point in time when TOFF changes from low to high, the SR latch 320 in FIG. 3 is reset so that M1 is turned off. The off-control circuit in FIG. 4 compares the points in time when the rising edge of the signal VGB and the rising edge of VKA_POS occur. Here, said rising edge of the signal VGB is one that is generated by inverting the output signal VG from the gate driver 200. If the signal VG turns low at the point where VKA_POS is changed from low to high, it means that the on/off timing of the transistor is perfectly under control. Thus, the rising edge of VKA_POS is the control standard and the purpose as well.

Since the point in time when VKA_POS turns high is the point in time when the voltage VKA turns (+), if the point in time when the output signal VG from the gate driver 200 turns to a low level is at a later point in time than when VKA_POS turns high, the off timing of the gate driver 200 is required to be brought forward, or in the opposite case, is required to be push back. The D flip-flop 312-1 in FIG. 4 compares the phases of VGB and VKA_POS, wherein if VGB is high, i.e., M1 has been already turned off, at the point in time when VKA_POS turns high, the output Q turns high so as to increase the value of the up/down counter 312-2, or in the opposite case, decrease the value thereof. The variable delay component 311 changes the delay duration according to the output (DELAY) of the up/down counter 312-2. As the DELAY value becomes greater, the delay duration increases, so as to move back the point in time when M1 is turned off. The delay caused by the input DELAY of the variable delay component 311 may be shown as follows in Equation 1.

$$Td = Td0 + \Delta Td \times DELAY \quad (1)$$

In conclusion, Td determines the point in time when M1 is turned off, which is construed as determining an output pulse width of the gate driver 200.

Figure 5:
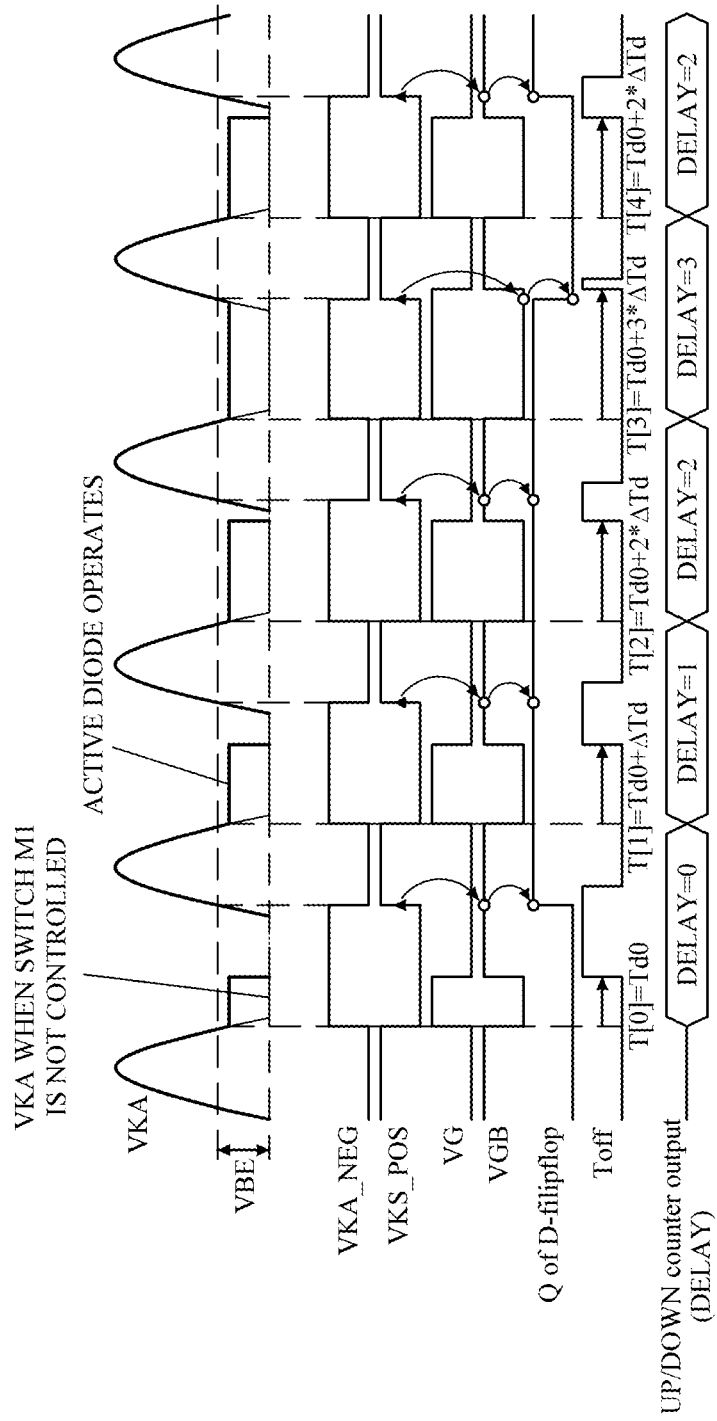
FIG. 5 is a diagram illustrating an example of operation timing of the off-control circuit illustrated in FIG. 4.

FIG. 5 is a diagram illustrating an example of operation timing of the off-control circuit according to an exemplary embodiment.

If a voltage VKA is lower than 0V, VKA_NEG turns high. VKA_POS is generated in the inverted form of VKA_NEG. In order to provide a description focused on operations, the delays caused by a comparator 100 and a gate driver 200 are not considered in FIG. 5. It is assumed that at the beginning, the up/down counter 312-2 is reset, to which the output DELAY is zero. Even though DELAY is zero, a variable delay component 311 still has an initial delay of Td0; this means VKA_NEG has a delay of Td0, which in turn generates a delayed TOFF signal. Here, since the point in time when VG turns low is faster than the point in time when VKA_POS turns high, the output of the D flip-flop 312-1 turns high, and the output of the up/down counter 312-2 increases by an increment of one at the rising edge of the inverted signal of VKA_POS. The output of the D flip-flop 312-1 is still high until the third cycle, but in the fourth cycle, the delay of the variable delay component 311 begins at a later time than the point in time when VKA_POS turns high, thereby resulting in the output of the up/down counter 312-2 being reduced by an increment of one.

After the fourth cycle, the output of the up/down counter 312-2 fluctuates between plus (+) or minus (−), thus entering into a steady state. Though somewhat exaggeratedly illustrated in FIG. 5, in the steady state, the TOFF timing is usually controlled consistently if the delay factor ΔTd, which is increased or decreased by DELAY, is a very small value. Thus, M1 is turned off in the optimum state. For convenience of description, the respective delays Td1 and Td2 of the comparator 100 and the gate driver 200 are assumed to be zero, but even though there are said delays present, the signal VGB of which phases are compared is generated by the delays Td1 and Td2 having been applied, thus the delays Td1 and Td2 being compensated to generate TOFF. Such controlling may be too difficult if the frequency of VKA were to change very rapidly in the above-mentioned operations, but in an application where the frequency of VKA is almost regular, an active diode may be turned off at the exact time according to the above-mentioned operations.

Figure 6:
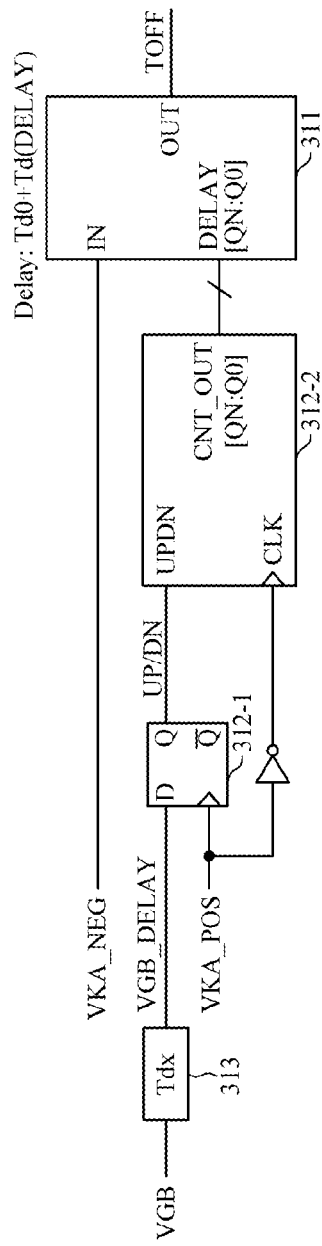
FIG. 6 is a diagram illustrating an example of an off-control circuit, in which delays that may occur due to both a comparator and a gate driver is compensated.

However, in an actual circuit, a delay may occur when the signal VKA_POS is generated. To compensate for this delay, an off controller 310 may further include a delay component 313, as illustrated in FIG. 6. The delay component 313 adds, to the signal VGB, a delay as much as Tdx and inputs the result. Accordingly, the delay of VKA_POS generated by a comparator 100 and a logic circuit may be compensated.

In conclusion, an active diode according to an exemplary embodiment of the present invention detects the voltage VKA between the opposite ends of the diode, finds the point in time for the active diode to be turned off, and delays the signal that turns the active diode on so as to generate an off signal that turns off the active diode. Then, a variable delay circuit that generates a delay is controlled through a proposed controller so as to compensate for delays generated in a comparator, a gate driver, and a logic circuit, thereby performing the optimum operations.

Figure 7:
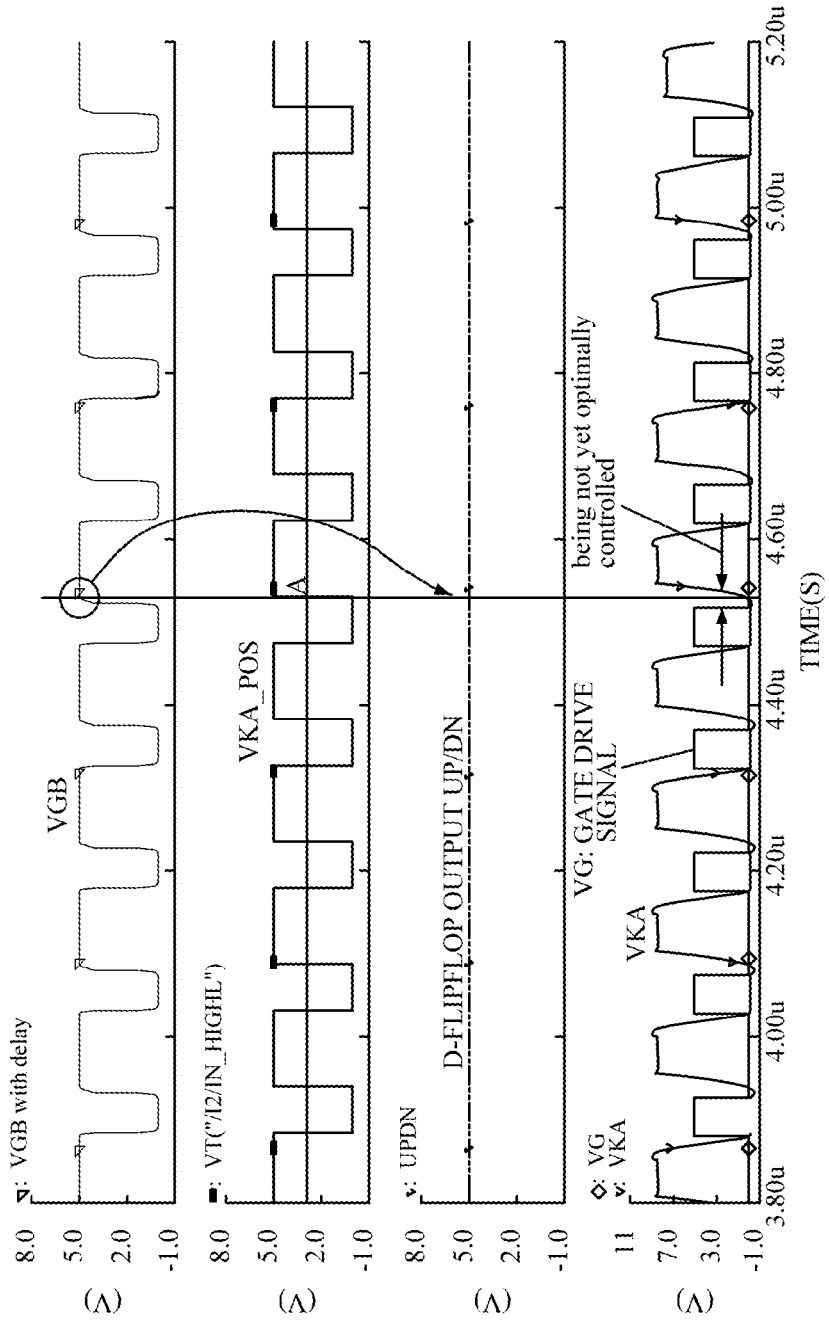
FIGS. 7 and 8 are diagrams illustrating simulations of off-control circuits according to an exemplary embodiment.
Figure 8:
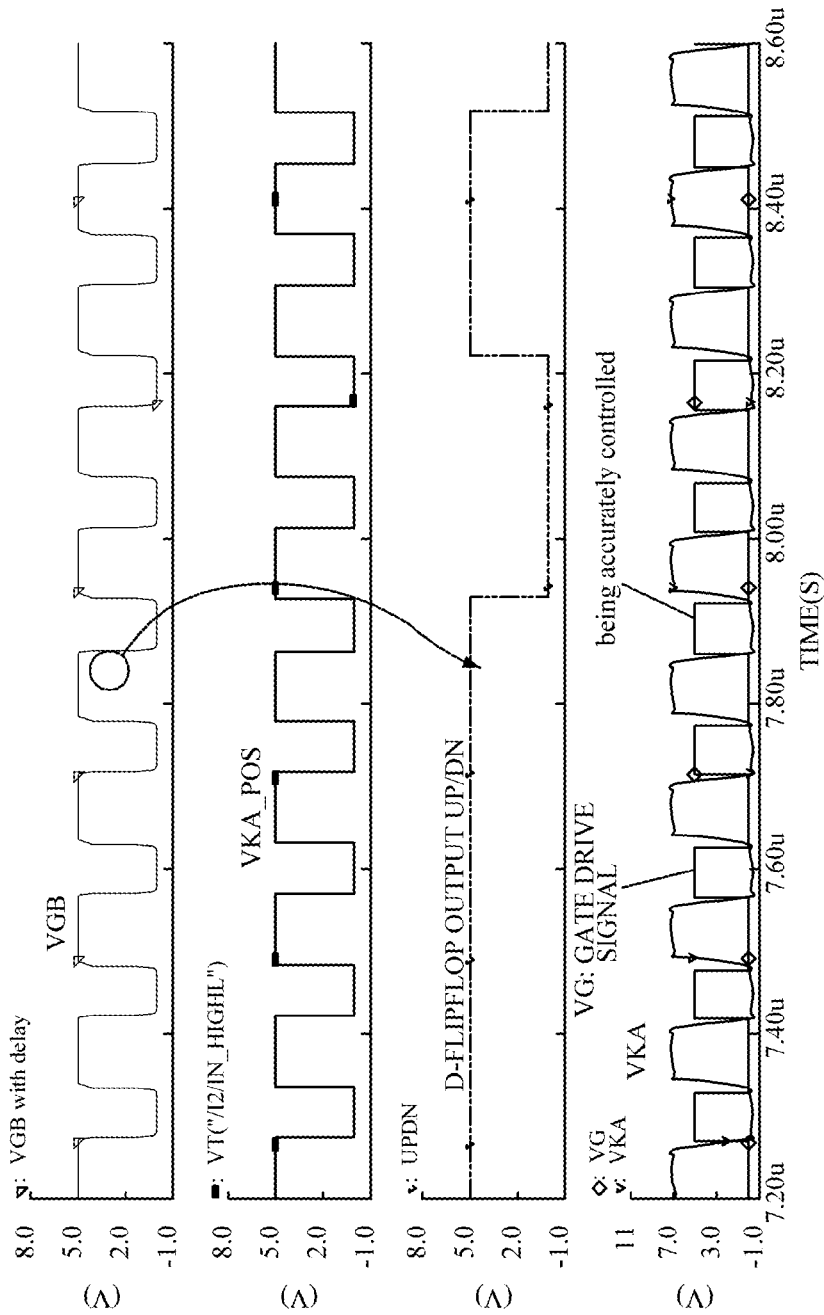

FIGS. 7 and 8 are diagrams illustrating simulations of off-control circuits according to an exemplary embodiment, wherein FIG. 7 illustrates a state in which a control of the off-control is not yet complete, and FIG. 8 illustrates a state in which a control of the off-control is complete.

As illustrated in FIG. 7, since the off-control is not completely controlled, the input UPDN of the up/down counter 312-2 is H. If the control of the off-control is complete, and then the output of the up/down counter 312-2 goes into a steady state, the output up/down of the D flip-flop is repeated as illustrated in FIG. 8 so that the delay is controlled, and the gate drive signal VG is generated by the delay compensations of the comparator 100, the gate driver 200, and the logic circuit.

While this invention has been particularly shown and described with reference to preferred embodiments thereof, it will be understood by those skilled in the art that various changes in form and details may be made therein without departing from the spirit and scope of the invention as defined by the appended claims. The preferred embodiments should be considered in descriptive sense only and not for purposes of limitation. Therefore, the scope of the invention is defined not by the detailed description of the invention but by the appended claims, and all differences within the scope will be construed as being included in the present invention.

The invention claimed is:
1. An active diode, comprising:
a comparator configured to compare voltages at opposite ends of a parasitic diode of a transistor; and a gate driver configured to, in response to the comparison result of the comparator, control a gate terminal of the transistor, wherein the active diode further comprises:
an off-timing controller configured to turn off the transistor at a point in time when the voltages at the opposite ends of the parasitic diode is positive;
wherein the off-timing controller is configured to adjust when the transistor is to be turned off based on an output signal from the comparator and a gate operation signal of the gate driver.

2. The active diode of claim 1, wherein the off-timing controller comprises:
an off controller configured to receive the output signal from the comparator and output the received output signal, wherein the off controller delays and outputs the output signal of the comparator based on each inverted signal of the output signal from the comparator and the gate operation signal of the gate driver; and
a logic circuit configured to receive the delayed output signal from the off controller and turn off the gate driver.

3. The active diode of claim 2, wherein the off controller comprises:
a variable delay component configured to receive the output signal from the comparator and output the received output signal, wherein the off controller delays and outputs the output signal of the comparator according to a basic delay value and a variable additional delay value; and
a counter configured to receive each inverted signal of the output signal from the comparator and the gate operation signal of the gate driver and count the additional delay value.

4. The active diode of claim 3, wherein the counter comprises:
a D flip-flop configured to receive each inverted signal of the output signal from the comparator and the gate operation signal from the gate driver; and
an up/down counter configured to count up or down the additional delay value according to the output of the D flip-flop.

5. The active diode of claim 4, wherein the off controller further comprises a delay component configured to delay the inverted signal of the gate operation signal and the delayed inverted signal to the D flip-flop.

6. The active diode of claim 2, wherein the logic circuit is an SR latch configured to receive the output signal of the comparator into a set terminal thereof and the delayed output signal of the off controller into a reset terminal thereof.

* * * * *